United States Patent
Koyama

[11] Patent Number: 5,916,733
[45] Date of Patent: Jun. 29, 1999

[54] METHOD OF FABRICATING A SEMICONDUCTOR DEVICE

[75] Inventor: Haruhiko Koyama, Chiba-ken, Japan

[73] Assignee: Kabushiki Kaisha Toshiba, Kawasaki, Japan

[21] Appl. No.: 08/762,856

[22] Filed: Dec. 10, 1996

[30] Foreign Application Priority Data

Dec. 11, 1995 [JP] Japan ..................................... 7-321535

[51] Int. Cl.⁶ ....................................................... G03F 7/20
[52] U.S. Cl. ........................... 430/296; 430/312; 430/316; 430/394; 430/942; 250/492.3
[58] Field of Search ..................... 430/312, 394, 430/313, 316, 317, 318, 296, 942; 250/492.3

[56] References Cited

U.S. PATENT DOCUMENTS

| | | | |
|---|---|---|---|
| 4,451,554 | 5/1984 | Kishi et al. ............................. | 430/313 |
| 4,603,473 | 8/1986 | Suemitsu et al. ....................... | 430/312 |
| 4,610,948 | 9/1986 | Glendinning ............................ | 430/312 |
| 4,612,274 | 9/1986 | Cho et al. ................................ | 430/312 |
| 5,034,091 | 7/1991 | Trask et al. ............................. | 430/318 |
| 5,656,128 | 8/1997 | Hashimoto et al. .................... | 430/318 |
| 5,700,705 | 12/1997 | Meguro et al. ........................... | 437/52 |
| 5,741,625 | 4/1998 | Bae et al. ................................. | 430/312 |

*Primary Examiner*—Kathleen Duda
*Attorney, Agent, or Firm*—Finnegan, Henderson, Farabow, Garrett & Dunner, L.L.P.

[57] ABSTRACT

A method of fabricating a semiconductor device includes steps of forming a first insulating film, a conductive film, a second insulating film and a selected film in sequence on a substrate. Next, a first resist pattern is formed in a first region on the selected film by means of photo-lithography. The selected film is patterned by using the first resist pattern, after which the first resist pattern is removed. Next, a second resist pattern is formed in a second region on the surface of at least the second insulating film by means of electron beam lithography. The second insulating film is patterned by using the second resist pattern, after which the second resist pattern is removed. The conductive film is then patterned by using the patterned second insulating film as a mask. The selected film is provided with an etching characteristic substantially the same as that of the conductive film so that remaining portions thereof are removed during the conductive film patterning step.

18 Claims, 8 Drawing Sheets

METHOD OF FABRICATING A SEMICONDUCTOR DEVICE

BACKGROUND OF THE INVENTION

1. Field of the Invention

The present invention relates to a method of fabricating a semiconductor device and more particularly to a method of fabricating a semiconductor device by forming resist masks by using both photo-lithography and electron beam lithography and by using them as patterning masks of underlying layers.

2. Description of the Related Art

Hitherto, steps of forming a conductive film on the whole surface of a semiconductor substrate and of patterning and processing it into a predetermined shape to form a wiring layer and the like are implemented in fabricating semiconductor devices.

Among the steps of forming the wiring layer, steps of forming a gate electrode wire and a wire connecting region of a MOS transistor will be explained below as conventional technology with reference to FIGS. 1 through 3. It is noted that in the following explanation, the wire connecting region is assumed to be connected with the gate electrode wire. Further, it is assumed that this wire connecting region is formed to be properly positioned and so that its size is larger than the gate electrode wire in order to contact a wiring layer which is not shown in the figures.

FIG. 4 (c) which is discussed below with respect to a description of the embodiments of the present invention, each of FIGS. 1(a), 2(a) and 3(a) is a sectional view of a part corresponding to a section along a line A—A in FIG. 4(c) and each of FIGs. 1(b), 2(b) and 3(b) is a sectional view of a part corresponding to a section along a line B—B in FIG. 4(c).

First, a field insulating film 112 is formed on an element separating region of a semiconductor substrate 111 and a gate insulating film 113 is formed on an element region of the semiconductor substrate 111 as shown in FIGs. 1(a) and 1(b). While a case in which the field insulating film 112 is formed by means of LOCOS (Local Oxidation of Silicon) is shown in the figures, it may also be formed by means of STI (Shallow Trench Isolation). Next, a conductive film 114 is formed on these insulating films 112 and 113 as a polycrystal silicon film or the like to form the gate electrode wire. Then, a cap insulating film 115 is formed on the conductive film 114. It is noted that the conductive film 114 and the cap insulating film 115 are deposited by means of CVD (Chemical Vapour Deposition) or sputtering. After that, a resist for photo-lithography or for electron beam lithography is applied on the cap insulating film 115 and a resist pattern 116 is formed by exposing the resist into the shape of the gate electrode wire by means of photo-lithography or electron beam lithography and by developing the exposed resist.

Following that, the cap insulating film 115 is patterned by means of anisotropic etching by using the resist pattern 116 as a mask as shown in FIGS. 2(a) and 2(b). Next, the resist pattern 116 used as the mask in etching is removed by means of ashing or the like.

Then, the conductive film 114 is patterned by means of anisotropic etching by using the patterned cap insulating film 115 as a mask to form the gate electrode wire and the wiring connecting section connected thereto as shown in FIGS. 3(a) and 3(b).

While the example described above shows the method for forming the gate electrode wire and the wire connecting region connected thereto of the MOS transistor, the same fabricating steps may also be used in forming a wiring layer and a wire connecting region between other elements.

While photo-lithography in which g-ray, i-ray or KrF excimer laser is used as a light source is generally used in patterning the resist used as a mask for forming a wire in the prior art, it is also possible to use electron beam lithography by which a pattern is drawn by means of electron beams.

Photo-lithography is a method normally used in forming a resist pattern and is suited for mass-production of semiconductor devices because its throughput is relatively high. However, it has a problem in terms of resolution in view of the fabrication of ultra LSIs which will be refined further in the future. According to the present photo-lithography technology, a width of about 0.25 μm is considered to be the limit in patterning even if a KrF excimer laser is used as a light source. While the design rule for wiring is predicted to become around 0.1 μm or less following the trend of the refinement of ultra LSIs of the future, it is difficult to pattern a wire to meet such a design rule by using the present photo-lithography technology.

Meanwhile, electron beam lithography has a higher resolution as compared to photo-lithography and is considered to be fully able to enable patterning to meet the design rule of around 0.1 μm or less. However, as compared to photo-lithography, it has had a problem that its throughput is extremely low. This is because, while a plane of a resist can be exposed in a wide range at one time by photo-lithography, the plane of the resist cannot be exposed in a wide range at one time by electron beam lithography and it is necessary to trace a pattern on a region to be exposed with the electron beam.

Normally, a pattern whose design rule is relatively large, i.e., a pattern which can be fully patterned even by using the present photo-lithography techniques, and a pattern whose design rule is relatively small, i.e., a pattern which is difficult to pattern by the present photo-lithography techniques, are mixed in patterns of wires among elements of a semiconductor integrated circuit. In such cases, typically, an area of the pattern whose design rule is relatively large, is larger than an area of a pattern whose rule is relatively small. It is then conceivable to use electron beam lithography only in forming the pattern whose design rule is small and which is hard to pattern by photo-lithography and to use photo-lithography in forming patterns other than that in order to improve both the throughput and the resolution.

However, types of resists formed as a mask for etching by photo-lithography and electron beam lithography are different. Accordingly, it is impossible to simply use both photo-lithography and electron beam lithography. If both photo-lithography and electron beam lithography are to be used by using resists which correspond to respective lithographs, it may be necessary to perform electron beam lithography after forming a mask for covering a resist pattern formed by photo-lithography so that it is not affected by electron beams or to remove the mask after using it as a mask for electron beam lithography, for example, thus increasing the number of processing steps. Meanwhile, although a resist which may be exposed by both light and electron beams without reducing resolution is under development, it is not yet available for practical use.

Further, although it is conceivable to pattern all of the patterns having large and small design rules by electron beam lithography, the throughput drops significantly in this case. This is because, while a plane of a resist can be exposed in a wide range at one time by photo-lithography, this is not the case for electron beam lithography. Instead, it is necessary to trace a pattern on a region to be exposed with the electron beam, as described above. Presently, while a time necessary for exposing resists by photo-lithography per wafer is about several minutes including a time necessary for moving the wafer, it takes several hours per wafer by electron beam lithography. Accordingly, it is not realistic to expose resist patterns only by electron beam lithography in fabricating semiconductor devices which are mass-produced specially in a large scale production.

SUMMARY OF THE INVENTION

Accordingly, it is an object of the present invention to provide a method of fabricating semiconductor devices in which electron beam lithography is used in patterning a resist for a portion for which a design rule is small and photo-lithography is used in patterning a resist in another portion, such as in steps for forming a wiring layer in order to be able to prevent the drop of the throughput, and while providing refinements of semiconductor devices.

Thus, in accordance with the present invention, there is provided a method of fabricating a semiconductor device, comprising steps of forming a first insulating film, a conductive film, a second insulating film and a selected film whose etching characteristic is substantially the same as that of the conductive film sequentially on a semiconductor substrate having first and second regions; forming a first resist pattern in the first region on the selected film by means of photo-lithography; patterning the selected film by using the first resist pattern as a mask; removing the first resist pattern; forming a second resist pattern in the second region on the surface of at least the second insulating film by means of electron beam lithography; patterning the second insulating film by using the second resist pattern and the selected film as masks; removing the second resist pattern; and patterning the conductive film by using the patterned second insulating film as a mask.

Also in accordance with the present invention, there is provided a method of fabricating a semiconductor device, comprising steps of forming a first insulating film, a conductive film, a second insulating film and a selected film whose etching characteristic is substantially the same as that of the conductive film sequentially on a semiconductor substrate having first and second regions; forming a second resist pattern in the second region on the selected film by means of electron beam lithography; patterning the selected film by using the second resist pattern as a mask; removing the second resist pattern; forming a first resist pattern in the first region on at least the second insulating film by means of photo-lithography; patterning the second insulating film by using the first resist pattern and the selected film as masks; removing the first resist pattern; and patterning the conductive film by using the patterned second insulating film as a mask.

The above and other features of the present Invention will become more apparent in the following description and the accompanying drawings in which like numerals refer to like parts.

DETAILED DESCRIPTION OF THE PREFERRED EMBODIMENTS

Figure 1:
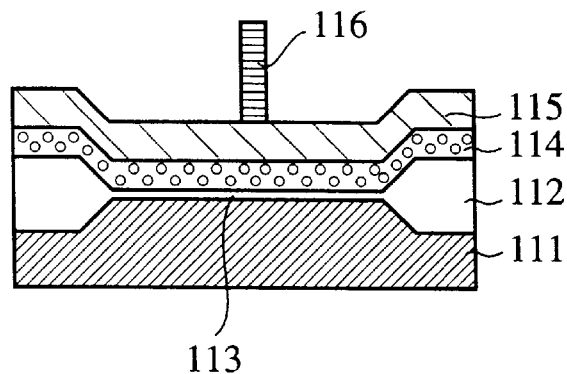
FIGS. 1(a) and 1(b) are sectional views showing a step for explaining a conventional method of fabricating a semiconductor device.
Figure 1:
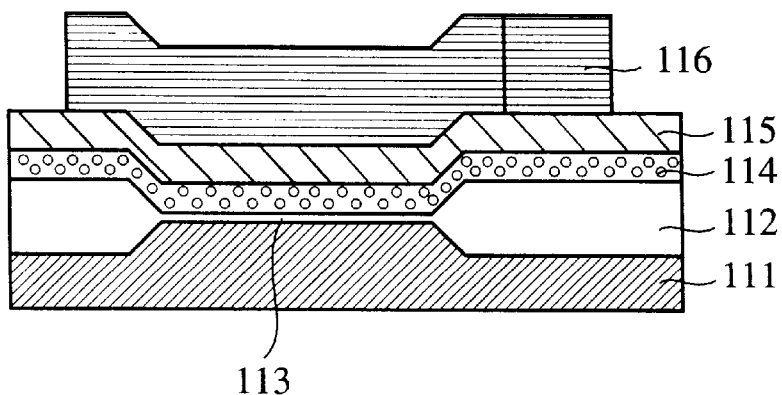
Figure 2:
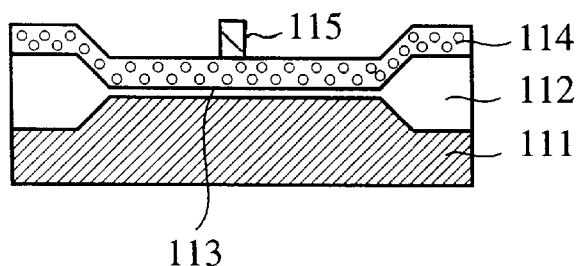
FIGS. 2(a) and 2(b) are sectional views showing another step which follows the step shown in FIGS. 1(a) and 1(b) for explaining the conventional method of fabricating the semiconductor device.
Figure 2:
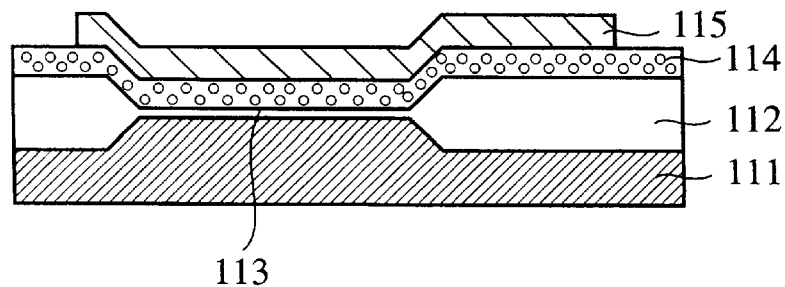
Figure 3:
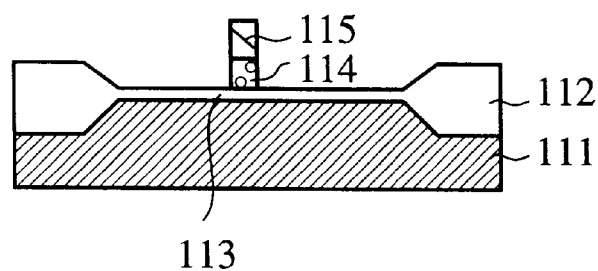
FIGS. 3(a) and 3(b) are sectional views showing another step which follows the step shown in FIGS. 2(a) and 2(b) for explaining the conventional method of fabricating the semiconductor device.
Figure 3:
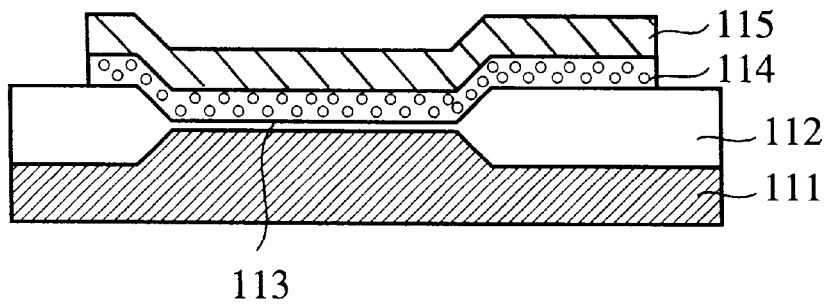
Figure 4:
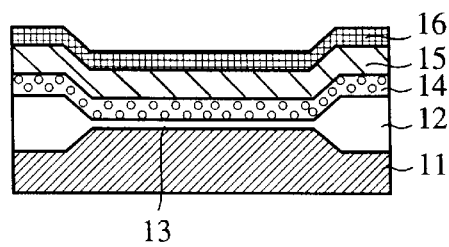
FIGS. 4(a) through 4(c) are sectional views showing a step for explaining a firs t embodiment of the present invention.
Figure 4:
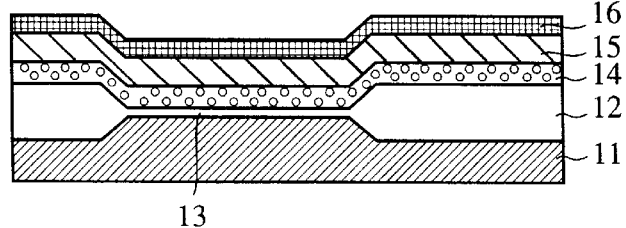
Figure 4:
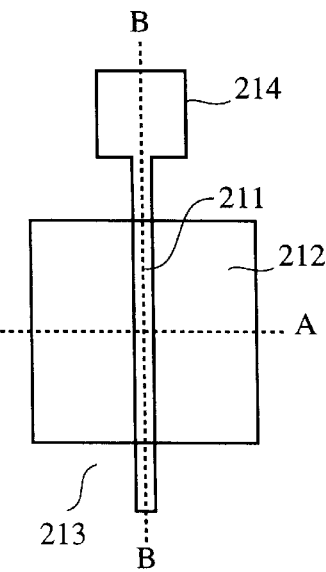
Figure 5:
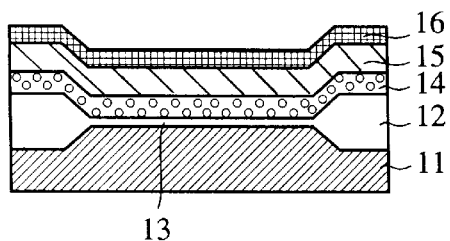
FIGS. 5(a) and 5(b) are sectional views showing another step which follows the step shown in FIGS. 4(a) and 4(b) for explaining the first embodiment of the present invention.
Figure 5:
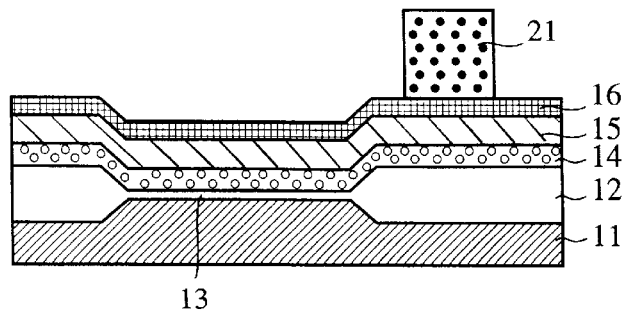
Figure 6:
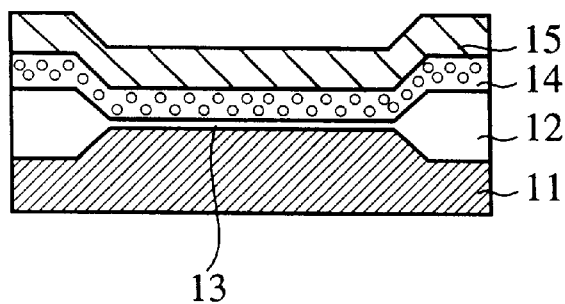
FIGS. 6(a) and 6(b) are sectional views showing another step which follows the step shown in FIGS. 5(a) and 5(b) for explaining the first embodiment of the present invention.
Figure 6:
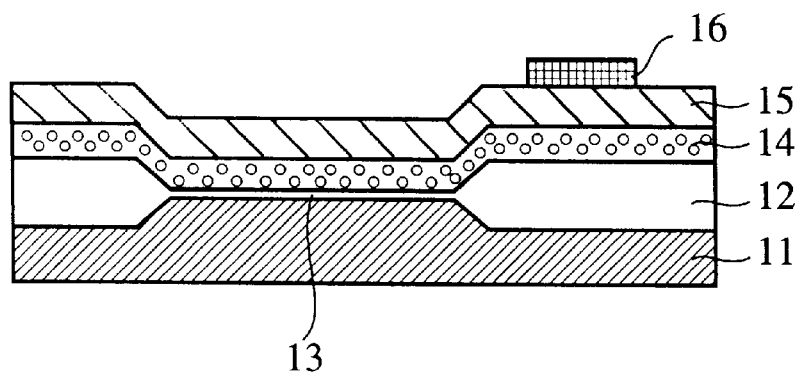
Figure 7:
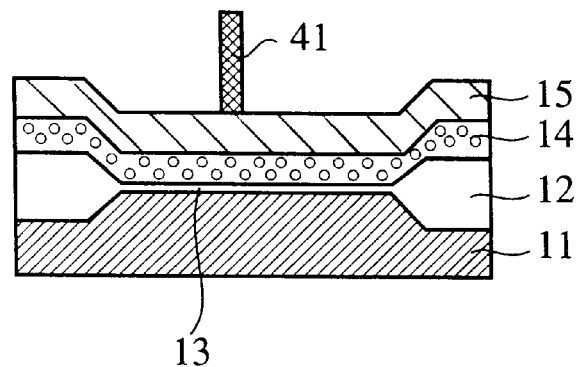
FIGS. 7(a) and 7(b) are sectional views showing another step which follows the step shown in FIGS. 6(a) and 6(b) for explaining the first embodiment of the present invention.
Figure 7:
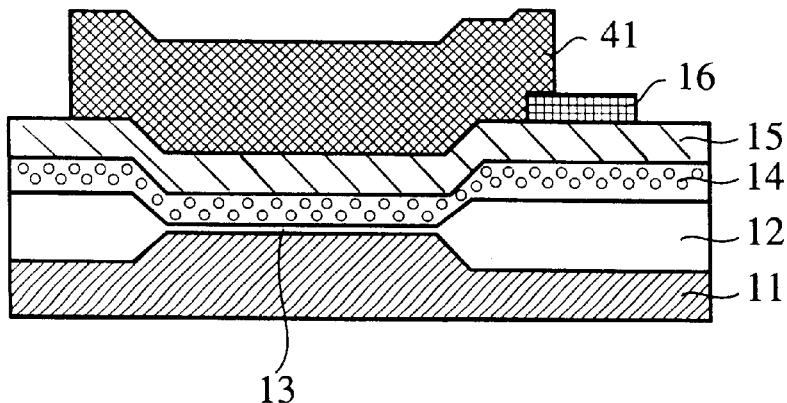
Figure 8:
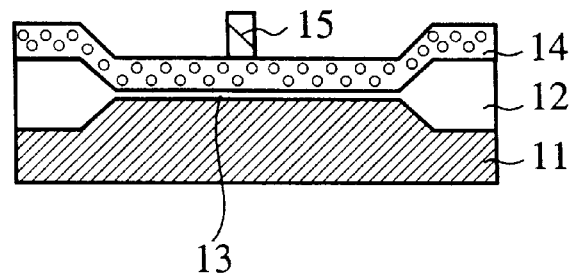
FIGS. 8(a) and 8(b) are sectional views showing another step which follows the step shown in FIGS. 7(a) and 7(b) for explaining the first embodiment of the present invention.
Figure 8:
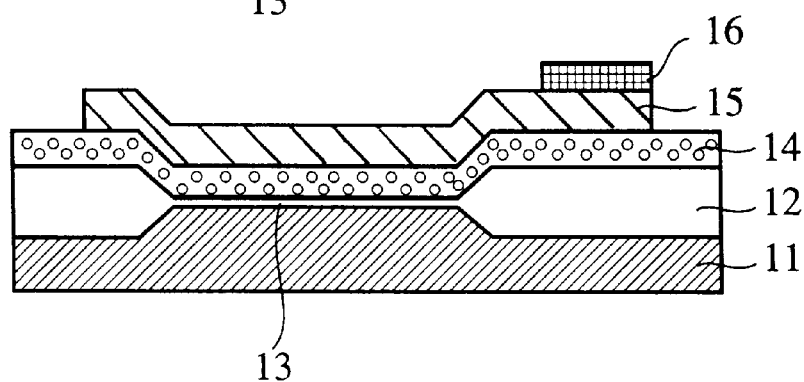
Figure 9:
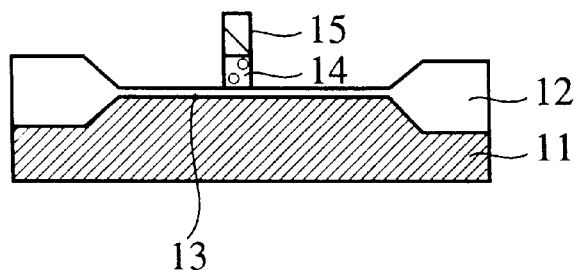
FIGS. 9(a) and 9(b) are sectional views showing another step which follows the step shown in FIGS. 8(a) and 8(b) for explaining the first embodiment of the present invention.
Figure 9:
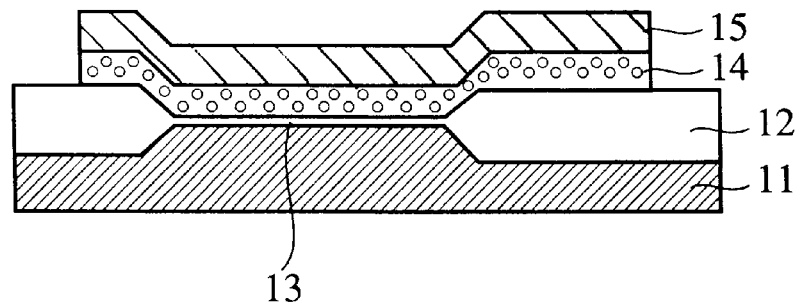
Figure 10:
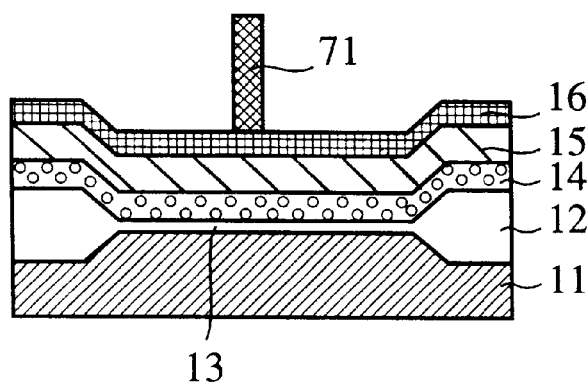
FIGS. 10(a) and 10(b) are sectional views showing a step for explaining a second embodiment of the present invention.
Figure 10:
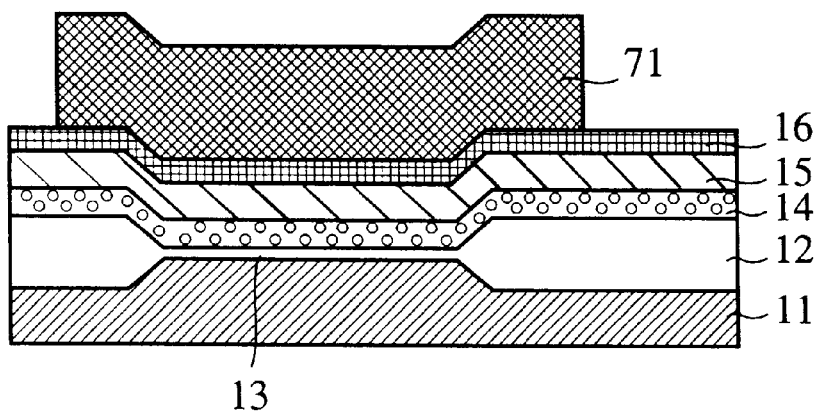
Figure 11:
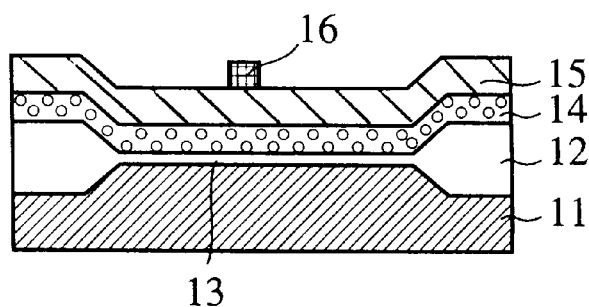
FIGS. 11(a) and 11(b) are section views showing another step which follows the step shown in FIGS. 10(a) and 10(b) for explaining the second embodiment of the present invention.
Figure 11:
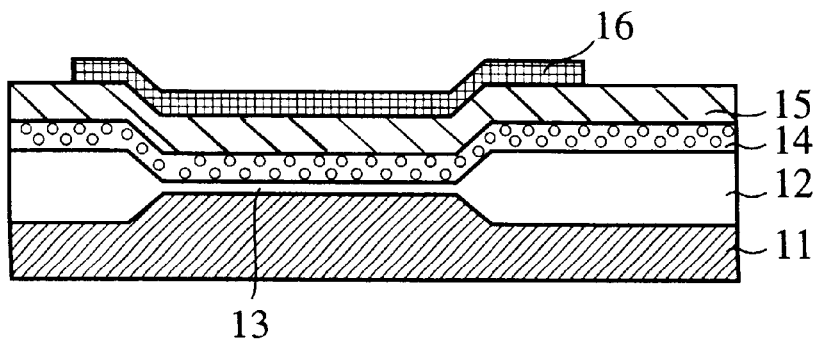
Figure 12:
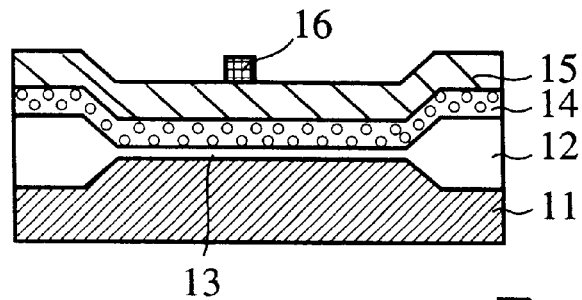
FIGS. 12(a) and 12(b) are sectional views showing another step which follows the step shown in FIGS. 11(a) and 11(b) for explaining the second embodiment of the present invention.
Figure 12:
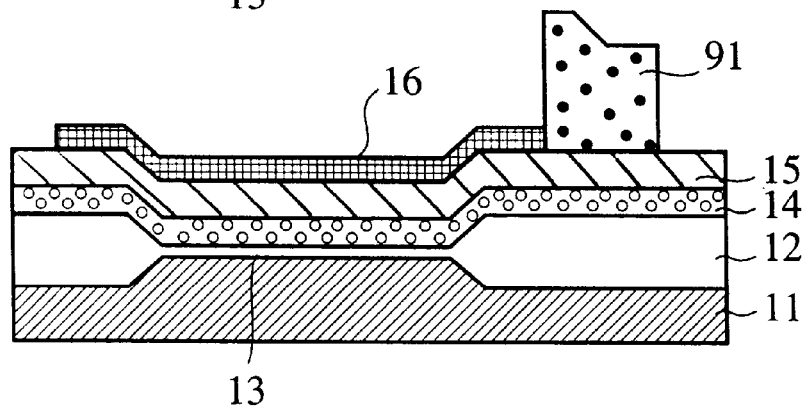
Figure 13:
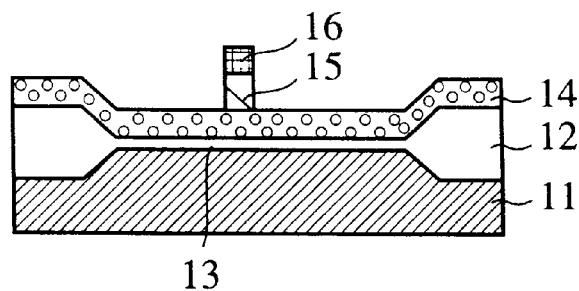
FIGS. 13(a) and 13(b) are sectional views showing another step which follows the step shown in FIGS. 12(a) and 12(b) for explaining the second embodiment of the present invention.
Figure 13:
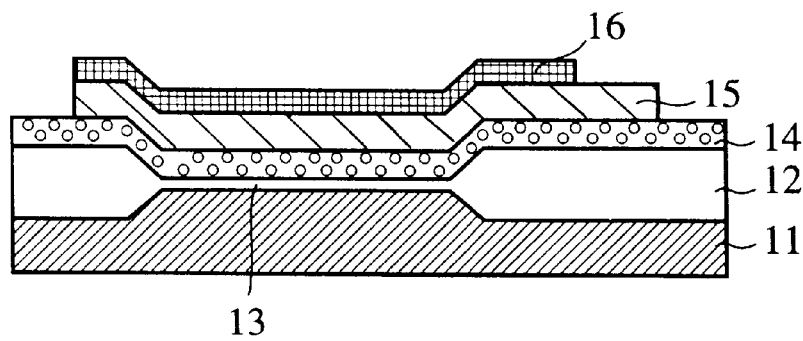
Figure 14:
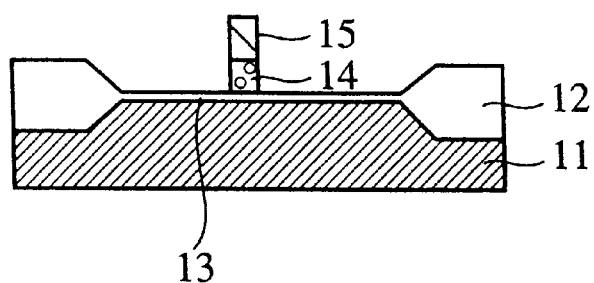
FIGS. 14(a) and 14(b) are sectional views showing another step which follows the step shown in FIGS. 13(a) and 13(b) for explaining the second embodiment of the present invention.
Figure 14:
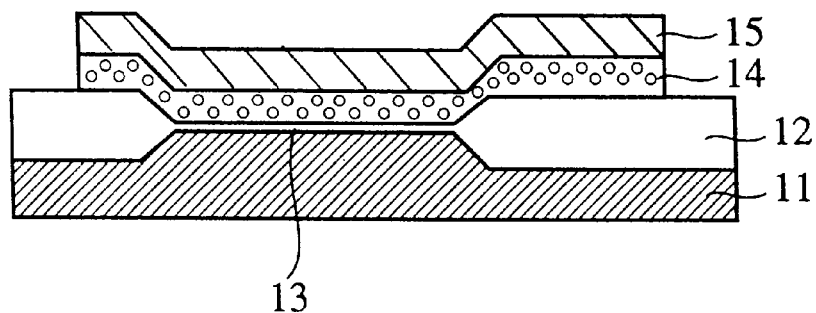

As a first embodiment of the present invention, steps for fabricating a gate electrode wire and a wire connecting region connected thereto of a MOS transistor will be explained with reference to FIGS. 4(a) through 9 (b). It is noted that FIG. 4(c) is a schematic top view of the MOS transistor after forming each element. FIG. 4(c) shows a region 211 in which the gate electrode wire is formed, an element region 212 in which an element is formed, an element separating region 213 and a region 214 in which the wire connecting region is formed. Each of FIGS. 4(a) through 9(a) shows a sectional view which corresponds to a section along a line A—A in FIG. 4 (c), i.e., a section in the direction perpendicular to the gate electrode wire, and each of FIGS. 4(b) through 9(b) shows a sectional view which corresponds to a section along a line B—B in FIG. 4(c), i.e., a section in the direction parallel to the gate electrode wire. It is assumed that the wire connecting region is formed to have a larger dimension as compared to the gate electrode wire and is positioned to contact an upper wiring layer which is not shown.

First, a field insulating film 12 is formed in the element separating region 213 on a semiconductor substrate 11 as shown in FIGS. 4 (a) and 4(b) by means of LOCOS. It may also be formed by means of STI, instead of LOCOS. Next, gate oxidation is implemented to form a gate insulating film 13 having a thickness of 5 to 20 nm on the element region 212. Then, a conductive film 14 of 100 to 400 nm in thickness is formed by means of CVD or sputtering on the gate insulating film 13 to form the gate electrode wire. A cap insulating film 15 of about 200 nm in thickness is then formed on the conductive film 14 by means of CVD or the like. A film 16 whose etching characteristic is substantially the same as that of the conductive film 14 and which has a thickness equal to or less than that of the conductive film 14 is formed on the cap insulating film 15.

Here, the conductive film 14 is formed of polycrystal silicon containing a high concentration of phosphorus or boron or a high-melting point metal such as tungsten, or of a layered structure in which a high-melting point metal silicide such as tungsten silicide or molybdenum silicide is used for the upper layer and polycrystal silicon is used for the lower layer, or of a layered structure in which a high-melting point metal such as tungsten or molybdenum is used for the upper layer and polycrystal silicon is used for the lower layer.

The cap insulating film 15 is formed of a material which allows enough selectivity in etching relative to the conductive film 14, e.g., of a silicon oxide film, a silicon nitrate film or the like.

The film 16 is formed of a material having an etching characteristic which is substantially the same as that of the conductive film 14, so that it is removed by etching during a step of patterning the conductive layer 14. In this regard, film 16 can, for example, be formed of the same material that is used for forming the whole or part of the conductive film 14, a material containing the material of the conductive film 14, e.g., polycrystal silicon, high-melting point metal or high-melting point metal silicide, or a material containing more than one of them. It is desirable to form the film 16 of polycrystal silicon because the selectivity in etching of the high-melting point metal or high-melting point metal silicide is around several times relative to polycrystal silicon. Thus, it is desirable to form the film 16 of polycrystal silicon when the conductive film 14 is formed of a single layer of polycrystal silicon or high-melting point metal or when the conductive film 14 is formed by layering high-melting point metal or high-melting point metal silicide and polycrystal silicon.

It is noted that when the film 16 is formed of polycrystal silicon, it is desirable to form the polycrystal silicon such that its thickness is less than that of the polycrystal silicon formed as part of the conductive film 14, such as when the conductive film 14 is formed as layered structure.

However, as for the thickness and material of the film 16, conditions for removing it together with part of the conductive film 14 during etching to form a gate electrode described later may be selected.

Following that, a resist for photo-lithography is applied on the whole surface of the film 16 as shown in FIGS. 5(a) and 5(b). Then, the resist is exposed in a predetermined pattern by means of photo-lithography and is developed to form a resist pattern 21. This resist pattern 21 is formed on a region where the design rule is relatively large and which can be fully achieved by photo-lithography. That is, it is not formed on a region such as the gate electrode wire which is difficult to form by photo-lithography but, instead, on a region such as the wire connecting region and a pad for connecting with upper layer wires. While it is presently possible to pattern a line width of about 0.25 $\mu$m by photo-lithography, the resist pattern is formed here to have a dimension of length and breadth of about 0.8 to 1.4 $\mu$m.

Then, the film 16 is etched by means of anisotropic etching by using the resist pattern 21 as a mask as shown in FIGS. 6(a) and 6(b). At this time, because the selectivity in etching of the cap insulating film 15 relative to the film 16 is high, it is possible to etch only the film 16 and to leave unaffected the cap insulating film 15. It is noted that the selectivity in etching the insulating film may be increased to about 10 to 30 times that of the film 16 by using $C_{12}$, HBr, $SF_6$ or the like as the etching gas in etching the film 16. Next, the resist pattern 21 is removed by means of ashing or by a combination of ashing and chemical treatment with sulfuric acid and hydrogen peroxide.

Then, a resist for electron beam lithography is applied on the cap insulating film 15 and the patterned film 16. Next, as shown in FIGS. 7(a) and 7(b), a resist pattern 41 is formed by exposing the resist by means of electron beam lithography and developing only the part which corresponds to the gate electrode wire and which is difficult to pattern by photo-lithography. While it is possible to pattern a line width of about 0.1 $\mu$m or less by electron beam lithography, the resist pattern is formed here to have a line width of about 0.15 $\mu$m.

It is noted that when one pattern is formed by combining a pattern whose design rule is relatively large and which can be fully handled by photo-lithography and a pattern whose design rule is small and which is difficult to pattern by photo-lithography and when there is a misalignment between them that could result in electrical disconnect there between, it is possible to deal with it by forming the resist pattern 41 to overlap with the film 16.

Then, the cap insulating film 15 is etched by means of anisotropic etching by using both the resist pattern 41 and the film 16, whose patterning has been completed by the previous processing steps, as masks as shown in FIGS. 8(a) and 8(b). At this time, because the selectivity in etching of the cap insulating film 15 relative to the conductive film 14 and to the film 16 is relatively high, it is possible to etch only the cap insulating film 15 and to leave the conductive film 14 and the film 16. It is noted that the selectivity in etching relative to the conductive film may be increased to about 10 to 30 times that of the film 16 by combining and using $CF_4$, CO, $CHF_3$ and the like as etching gas in etching the cap insulating film 15. Next, the resist pattern 41 is removed by means of ashing or by a combination of ashing and chemical treatment with sulfuric acid and hydrogen peroxide.

Then, the conductive film 14 is etched by means of anisotropic etching by using the cap insulating film 15 as a mask as shown in FIGS. 9(a) and 9(b). At this time, because the film 16 is formed of the material whose etching characteristic is substantially the same as that of the conductive film 14, it is etched and removed at the same time with the etching of the conductive film 14. Accordingly, a step for removing the film 16 may be omitted. It is noted that the selectivity in etching the cap insulating film 15 may be increased to about 10 to 30 times by using $C_{12}$, HBr, $SF_6$ or the like as etching gas in etching the conductive film 14. Thus, the steps for forming the gate electrode wire and the wire connecting region connected thereto are completed.

According to the first embodiment of the present invention, the film 16 whose etching characteristic is substantially the same as that of the conductive film 14 is formed on the cap insulating film 15. Then, after forming the resist pattern 21 for the region whose design rule is large and which can be handled by the photo-lithography technology, the film 16 is patterned by using the resist pattern 21 as a mask. Next, the resist pattern 41 which is the part which is difficult to handle by the photo-lithography technology is formed by using electron beam lithography and the cap insulating film 15 is patterned by using the resist pattern 41 and the patterned film 16 as masks. Then, finally, the conductive film 14 is patterned by using the patterned cap insulating film 15 as a mask. At the same time, the film 16 is removed with the conductive film 14, so that a step for removing the film 16 may be omitted.

Next, a second embodiment of the present invention will be explained with reference to FIGS. 10(a) through 14(b). It is noted that the same elements as those in the first embodiment will be denoted by the same reference numerals in the figures and their explanation will be omitted here. Further, a thickness and a material of each element shall be the same as those in the first embodiment unless specified otherwise. It is noted that each of FIGS. 10(a) through 14(a) is a sectional view which corresponds to the section along the line A—A in FIG. 4(c) and each of FIGS. 10(b) through 14(b) is a sectional view which corresponds to the section along the line B—B in FIG. 4(c).

First, the field insulating film 12, the gate insulating film 13, the conductive film 14, the cap insulating film 15 and the film 16 are formed sequentially on the semiconductor substrate 11 as shown in FIGS. 10(a) and 10(b). These steps are the same as those shown in FIGS. 4(a) through 4(c) in the first embodiment. Then, a resist for electron beam lithography is applied on the film 16 and only the region which is difficult to handle by photo-lithography is patterned by means of electron beam lithography to form a resist pattern 71. When there is a region in which a pattern whose design rule is large and which can be fully handled by photo-lithography and a pattern whose design rule is small and which is difficult to pattern by photo-lithography are combined and when there is a misalignment between them, it is possible to deal with it by forming the resist pattern 71 to overlap with the pattern whose design rule is large from the original pattern.

Then, the film 16 is etched by means of ansotropic etching by using the resist pattern 71 as a mask as shown in FIGS. 11(a) and 11(b). At this time, because the selectivity in etching of the film 16 relative to the cap insulating film 15 is high, it is possible to pattern only the film 16 and to leave the cap insulating film 15. Next, the resist pattern 71 is removed by means of ashing or by a combination of ashing and chemical treatment with sulfuric acid and hydrogen peroxide.

Then, a resist for photo-lithography is applied on the cap insulating film 15 and the film 16. Next, as shown in FIGS. 12(a) and 12(b), a resist pattern 91 is formed by exposing and developing the resist into a predetermined pattern by using photo-lithography. This resist pattern 91 is formed on a region where the design rule is relatively large and which can be fully handled by photo-lithography. That is, it is formed not on a region like the gate electrode wire which is difficult to handle by photo-lithography, but on a region which corresponds to the part for forming the wire connecting region or the pad for connecting with upper layer wires.

Then, the cap insulating film 15 is etched by means of anisotropic etching by using both the resist pattern 91 and the film 16 as masks as shown in FIGS. 13(a) and 13(b). At this time, because the selectivity in etching of the cap insulating film 15 relative to the conductive film 14 and to the film 16 is high, it is possible to pattern only the cap insulating film 15 and to leave the conductive film 14 and the film 16. Next, the resist pattern 91 is removed by means of ashing or by combination of ashing and chemical treatment with sulfuric acid and hydrogen peroxide.

Then, the conductive film 14 is etched by means of anisotropic etching by using the cap insulating film 15 as a mask as shown in FIGS. 14(a) and 14(b). At this time, because the film 16 is formed of the material whose etching characteristic is substantially the same as that of the conductive film 14, it is etched and removed at the same time with the conductive film 14. Accordingly, a separate step of removing the film 16 may be omitted. Thus, the steps for forming the gate electrode wire and the wire connecting region connected thereto are completed.

According to the second embodiment of the present invention, the film 16 whose etching characteristic is substantially the same as that of the conductive film 14 is formed on the cap insulating film 15 similarly to the first embodiment. Then, the resist pattern 71 is formed by using electron beam lithography in a region which is difficult to handle by photo-lithography technology at first and the film 16 is patterned by using it as a mask. Next, after forming the resist pattern 91 which is the region where the design rule is large and which can be handled by photo-lithography, the cap insulating film 15 is patterned by using the film 16 and the pattern 91 as masks. Then, finally, the conductive film 14 is patterned by using the patterned cap insulating film 15 as a mask. At the same time, the film 16 is removed with the conductive film 14, so that a step for removing the film 16 may be omitted. Thus, the sequence of forming the resist pattern by using photo-lithography and of forming the resist pattern by using electron beam lithography are different in the first and second embodiments.

In each embodiment described above, it becomes possible to use both photo-lithography and electron beam lithography by using the layered structure of the conductive film which becomes the gate electrode wire and the cap insulating film formed thereon and by providing the film whose etching characteristic is substantially the same as that of the conductive film. Further, because the film is removed at the same time in the step of etching the conductive film, a step of removing it may be omitted. Thereby, it becomes possible to select and pattern, by means of electron beam lithography, only a region whose design rule is small and which is difficult to pattern by present photo-lithography techniques. Accordingly, it becomes possible to deal with the refinement of ultra LSIs and to prevent production throughput from dropping.

It is noted that the thickness of the film 16 may be equal to or greater than that of the conductive film 14 in the embodiments described above so long as it has such a characteristic that it is removed at the same time in the step of etching the conductive film.

Further, although the steps for forming the gate electrode wire and the wire connecting region have been exemplified in the embodiments described above, the present invention is not confined only to them and may be applied to steps for forming wiring layers in general in which a conductive film and an insulating film are layered. Also, it may be applied to steps for forming a resistor element formed by a conductive film having a high resistance on a semiconductor substrate and for forming a connecting terminal connected to the resistor element. That is, because electron beam lithography allows a region whose line width is narrow to be patterned, a resistor element having a higher resistance may be formed in a very small region.

Moreover, the numerical values and materials cited above are not confined only to those described above but may be embodied variously in accordance with various modes.

Accordingly, while preferred embodiments of the present invention have been described, variations thereto will occur to those skilled in the art within the scope of the present inventive concepts which are delineated by the following claims.

What is claimed is:

1. A method of fabricating a semiconductor device, comprising steps of:
    forming a first insulating film, a conductive film, a second insulating film and a selected film whose etching characteristic is substantially the same as that of said conductive film sequentially on a semiconductor substrate having first and second regions;
    forming a first resist pattern in said first region on said selected film by means of photo-lithography;
    patterning said selected film by using said first resist pattern as a mask;
    removing said first resist pattern;
    forming a second resist pattern in said second region on the surface of at least said second insulating film by means of electron beam lithography;
    patterning said second insulating film by using said second resist pattern and said patterned selected film as masks;
    removing said second resist pattern; and
    patterning said conductive film by using said patterned second insulating film as a mask.

2. A method of fabricating a semiconductor device, comprising steps of:
    forming a first insulating film, a conductive film, a second insulating film and a selected film whose etching characteristic is substantially the same as that of said conductive film sequentially on a semiconductor substrate having first and second regions;
    forming a second resist pattern in said second region on said selected film by means of electron beam lithography;
    patterning said selected film by using said second resist pattern as a mask;
    removing said second resist pattern;
    forming a first resist pattern in said first region on at least said second insulating film by means of photo-lithography;
    patterning said second insulating film by using said first resist pattern and said patterned selected film as masks;
    removing said first resist pattern; and
    patterning said conductive film by using said patterned second insulating film as a mask.

3. The method of fabricating a semiconductor device according to claim 1 or 2, wherein said patterned selected film is removed at the same time as said conductive film in the step of patterning said conductive film.

4. The method of fabricating a semiconductor device according to claim 1 or 2, wherein said selected film is formed with a thickness less than or equal to that of said conductive film.

5. The method of fabricating a semiconductor device according to claim 1 or 2, wherein said first region is a region for forming a wire connecting region and said second region is a region for forming a gate electrode wire.

6. The method of fabricating a semiconductor device according to claim 1 or 2, wherein said first region is a region for forming a connecting section of a resistor element and said second region is a region for forming the resistor element.

7. The method of fabricating a semiconductor device according to claim 1 or 2, wherein said conductive film and said selected film are formed of the same material or including the same material.

8. The method of fabricating a semiconductor device according to claim 1 or 2, wherein said conductive film is formed by layering high-melting point metal silicide and polycrystal silicon and said selected film is formed of polycrystal silicon.

9. The method of fabricating a semiconductor device according to claim 1 or 2, wherein said conductive film is formed by layering a high-melting point metal and polycrystal silicon and said selected film is formed of polycrystal silicon.

10. The method of fabricating a semiconductor device according to claim 1 or 2, wherein said conductive film and said selected film are formed of polycrystal silicon.

11. The method of fabricating a semiconductor device according to claim 8, wherein the polycrystal silicon formed as said selected film is formed with a thickness less than or equal to the thickness of the polycrystal silicon layer of said conductive film.

12. The method of fabricating a semiconductor device according to claim 9, wherein the polycrystal silicon formed as said selected film is formed with a thickness less than or equal to the polycrystal silicon layer of said conductive film.

13. The method of fabricating a semiconductor device according to claim 10, wherein the polycrystal silicon formed as said selected film is formed with a thickness less than or equal to the thickness of the polycrystal silicon layer of said conductive film.

14. The method of fabricating a semiconductor device according to claim 1 or 2, wherein said second insulating film is formed of one of a silicon oxide film and a silicon nitrate film.

15. The method of fabricating the semiconductor device according to claim 1 or 2, wherein said second resist pattern is formed to extend to part of said first region from said second region when said first region and second region adjoin each other.

16. The method of fabricating a semiconductor device according to claims 1 or 2, wherein the step of forming said selected film includes a step of forming said selected film to have at least one of a thickness and composition such that any exposed portion of said selected film is removed by etching during said conductive film patterning step.

17. A method of fabricating a semiconductor device, comprising steps of:
    forming a first insulating film, a conductive film, a second insulating film and a selected film sequentially on a semiconductor substrate having first and second regions, said selected film having at least one of a thickness and composition such that any exposed portion thereof is removable by etching during a step of patterning said conductive film;
    forming a first resist pattern in said first region on said selected film by means of one of photo-lithography and electron beam lithography;
    patterning said selected film by using said first resist pattern as a mask;
    removing said first resist pattern;

forming a second resist pattern in said second region on the surface of at least said second insulating film by means of the other of photo-lithography and electron beam lithography;

patterning said second insulating film by using said second resist pattern and said patterned selected film as masks;

removing only said second resist pattern; and patterning said conductive film by using said patterned second insulating film as a mask and removing said selected film during the conductive film patterning.

18. A method of fabricating a semiconductor device, comprising steps of:

forming a first insulating film, a conductive film, a second insulating film and a selected film having an etching characteristic substantially the same as that of said conductive film sequentially on a semiconductor substrate having first and second regions;

forming a first resist pattern in said first region on said selected film by means of one of photo-lithography and electron beam lithography;

patterning said selected film by using said first resist pattern as a mask;

removing said first resist pattern;

forming a second resist pattern in said second region on the surface of at least said second insulating film by means of the other of photo-lithography and electron beam lithography;

patterning said second insulating film by using said second resist pattern and said patterned selected film as masks;

removing said second resist pattern; and patterning said conductive film by using said patterned second insulating film as a mask.

* * * * *

UNITED STATES PATENT AND TRADEMARK OFFICE
CERTIFICATE OF CORRECTION

PATENT NO.: 5,916,733

DATED: June 29, 1999

INVENTOR(S): Haruhiko KOYAMA

It is certified that an error appears in the above-identified patent and that said Letters Patent is hereby corrected as shown below:

Claim 12, column 10, line 30, after "equal to" insert --the thickness of--.

Signed and Sealed this

Eleventh Day of April, 2000

Attest:

Q. TODD DICKINSON

*Attesting Officer*

*Director of Patents and Trademarks*